Figure 1:
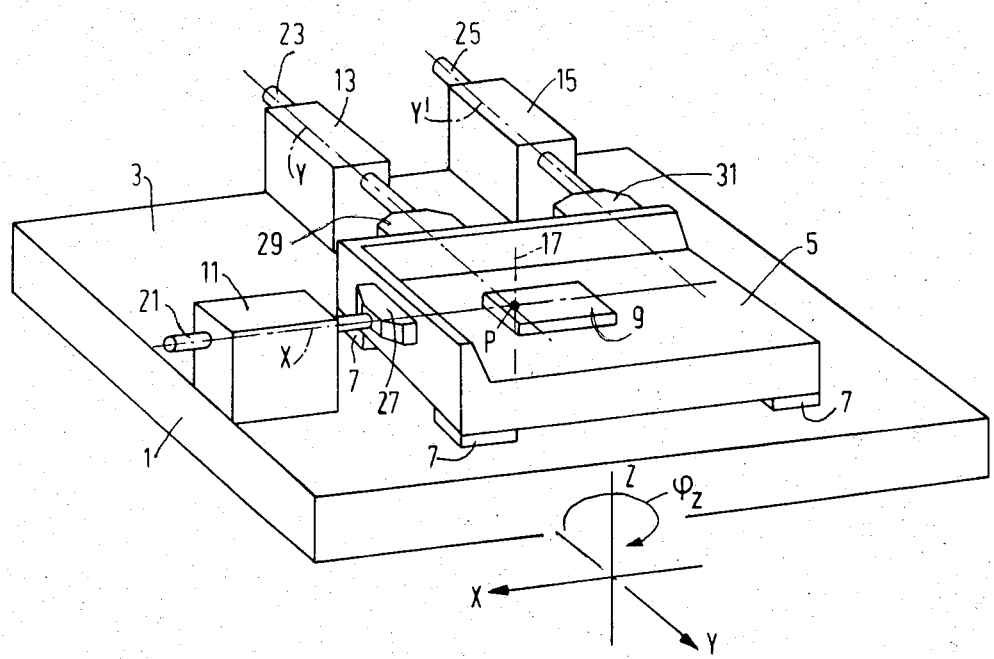

United States Patent [19]

Smulders et al.

[11] Patent Number: 4,628,238

[45] Date of Patent: Dec. 9, 1986

[54] POSITIONING DEVICE COMPRISING PRE-STRESSED CONTACTLESS BEARINGS

[75] Inventors: Hendricus F. G. Smulders; Johannes L. M. Hagen; Marinus J. J. Dona, all of Eindhoven, Netherlands

[73] Assignee: U.S. Philips Corporation, New York, N.Y.

[21] Appl. No.: 741,057

[22] Filed: Jun. 5, 1985

[30] Foreign Application Priority Data

Mar. 29, 1985 [NL] Netherlands ............................ 8500930

[51] Int. Cl.⁴ .................................................. G05B 1/06
[52] U.S. Cl. ...................................... 318/653; 318/135; 318/687
[58] Field of Search ................. 318/517, 653, 38, 135, 318/687

[56] References Cited

U.S. PATENT DOCUMENTS

| Re. 27,436 | 7/1972 | Sawyer ................................ | 318/38 |
| 3,466,514 | 9/1969 | Brunner et al. ..................... | 318/517 |
| 4,485,339 | 11/1984 | Trost ................................... | 318/653 X |
| 4,506,204 | 3/1985 | Galburt .............................. | 318/653 |
| 4,506,205 | 3/1985 | Trost et al. ........................ | 318/653 |
| 4,507,597 | 3/1985 | Trost .................................. | 318/653 |

FOREIGN PATENT DOCUMENTS 2067932  8/1981  United Kingdom .

Primary Examiner—B. Dobeck
Attorney, Agent, or Firm—Robert T. Mayer

[57] ABSTRACT

A positioning device having a plate-shaped carrier (5) which is displaceable in a horizontal plane and which is journalled on a table (1) and on which is exerted a pressure and tensile force, respectively, by means of at least two translation drives (11, 13). The translation drives (11, 13) are coupled to the carrier (5) by means of horizontally operating static thrust and tensile bearings, respectively (33 to 41, 49), which transfer via a viscous medium in a contactless manner pressure and tensile forces respectively, between the carrier (5) and the translation drives (11, 13). The contactless bearings (33 to 41, 49) are pre-stressed with a force which is larger than the maximum occurring tensile force between the drives (11, 13) and the carrier (5). Thus, a substantially frictionless coupling is obtained between the drives (11, 13) and the carrier (5). This coupling acts at the same time as a guide for the carrier (5).

15 Claims, 13 Drawing Figures

POSITIONING DEVICE COMPRISING PRE-STRESSED CONTACTLESS BEARINGS

The invention relates to a positioning device comprising a horizontal plate-shaped carrier, which is displaceable in two orthogonal coordinate directions and is journalled on a flat table, which device is provided with a first translation drive coupled to the carrier for exerting a pressure force on the carrier in a first coordinate direction and with a second translation drive coupled to the carrier for exerting a pressure force on the carrier in a second coordinate direction at right angles to the first coordinate direction, the forces exerted on the carrier by the first and the second drive lying in one horizontal plane.

In the known positioning device of the kind mentioned in the opening paragraph (U.S. Pat. No. 3,466,514), the translation drives coupled to the carrier are constituted by a screw spindle, opposite to which a spring-loaded plunger is arranged. The directions of movement of the screw spindle and the plunger coincide with each other. There exists a pressure contact with a comparatively high degree of friction between the end of the screw spindle and the end of a plunger rod connected to the plunger on the one hand and the carrier on the other hand. This friction is undesirable due to the hysteresis attended therewith, especially if the carrier has to perform very small displacements in the micron and submicron range.

The invention has for its object to provide a positioning device in which the said disadvantages are avoided.

For this purpose the invention is characterized in that the first drive is coupled in a contactless manner by means of a first horizontally operating static thrust and tensile or push and pull bearing, respectively, via a viscous medium to the carrier, while the second drive is coupled by means of a second horizontally operating thrust and tensile or push and pull bearing, respectively, via a viscous medium in a contactless manner to the carrier, both the first and the second thrust and tensile bearings, respectively, being pre-stressed in the first and second coordinate direction, respectively, with a force which is larger than the maximum occurring tensile force between the first and the second drive on the one hand and the carrier on the other hand.

By the use of pre-stressed contactless bearings as coupling means between the drives and the carrier, substantially the whole amount of friction between the drives and the carrier is eliminated (only a very small viscous friction remains present) so that hysteresis problems are avoided. The pre-stressed state of the contactless bearings renders it possible to exert with the drives a tensile force on the carrier so that in fact a thrust-tensile bearing is formed. The bearings have a dual function because they serve as guide and as coupling.

It should be noted that British Patent Application No. 2067932 discloses a positioning device comprising a vertically operating aerostatic thrust bearing which can be pre-stressed by a spring. However, this thrust bearing serves for horizontally guiding the carrier on a table. The coupling of the spindle drives to the carrier is effected by means of pivots.

A particular embodiment of the positioning device, in which the carrier can perform besides the translations in the two coordinate directions also a rotation about a vertical axis, is further characterized in that the arrangement is provided with a third translation drive coupled to the carrier for exerting a pressure and tensile force, respectively, on the carrier in a direction parallel to the second coordinate direction, the first, the second and the third drive being pivotable about a vertical axis with respect to the carrier.

A further embodiment of the positioning device, in which the pre-stress of the three bearings is obtained in a constructively simple manner, is characterized in that the first, the second and the third bearing are pre-stressed by means of a permanent magnet arranged therein.

A preferred embodiment of the positioning device, in which load variations lead to a comparatively small variation of the bearing capacity, is further characterized in that a part of the magnetic circuit corresponding to the permanent magnet is in the state of magnetic saturation.

A still further embodiment of the positioning device, which is suitable for use in conditioned rooms, is characterized in that the viscous medium is air.

A further embodiment of the positioning device with a comparatively simple arrangement of the permanent magnets is characterized in that the second and the third bearing are pre-stressed by means of a number of permanent magnets common to both bearings, which are arranged in the carrier.

A still further embodiment of the positioning device, in which the carrier has a comparatively high degree of rigidity against rotation about a vertical axis, is further characterized in that the second and the third bearing are coupled to each other by means of a beam-shaped guide, which is pivotable with respect to the second and the third drive about a vertical axis, while the first drive is pivotable about a vertical axis with respect to the carrier.

Figure 2:
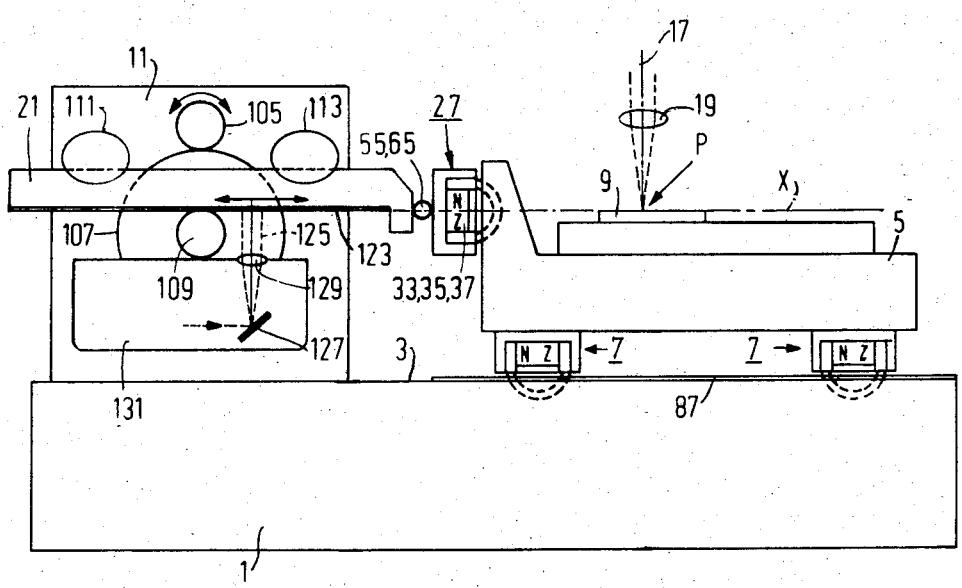
Figure 3:
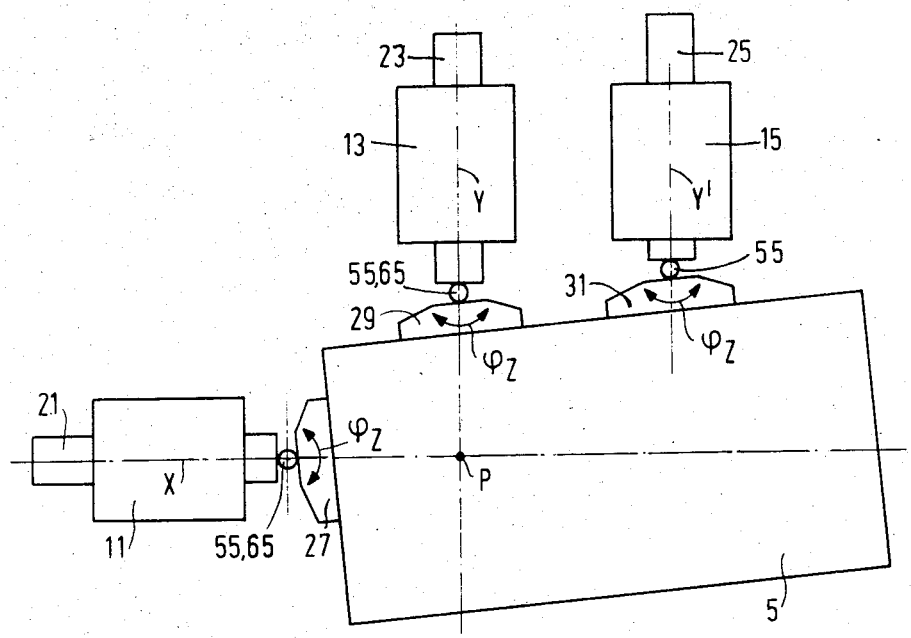
Figure 4:
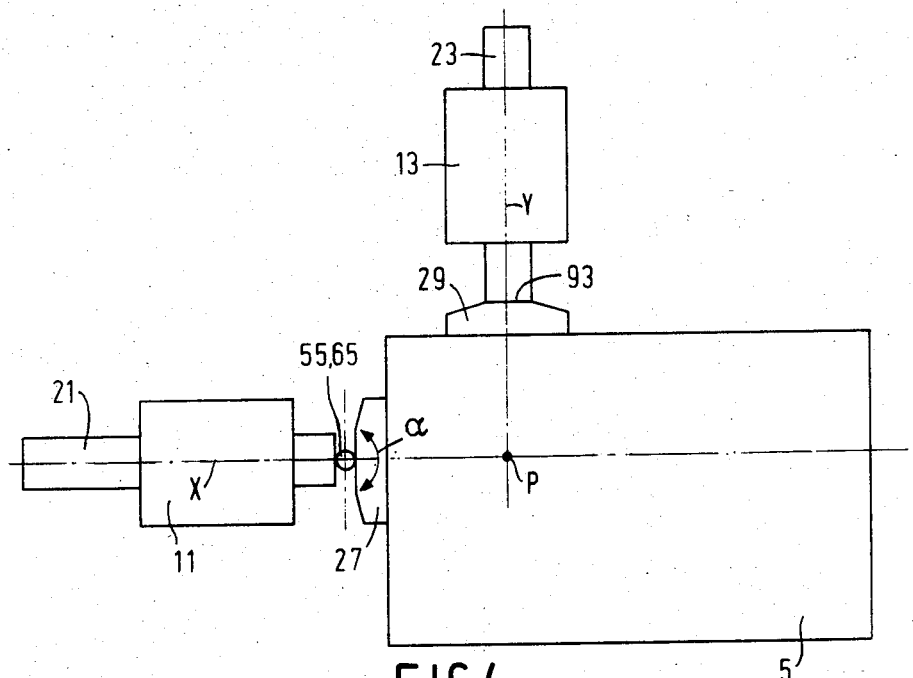
Figure 5:
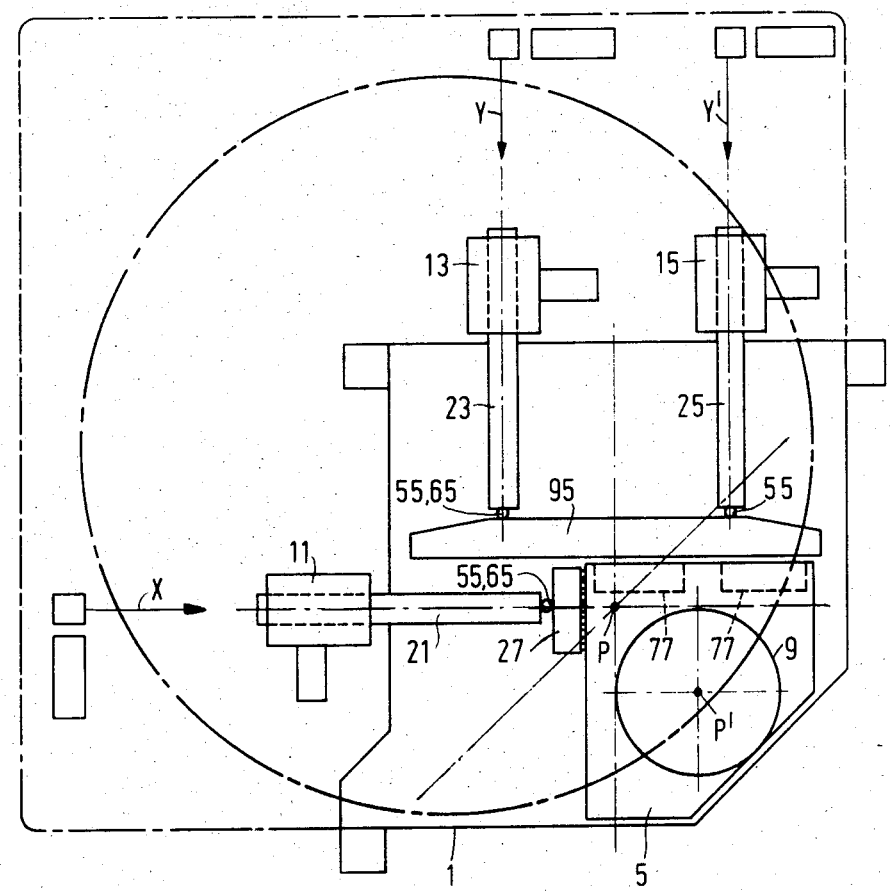
Figure 6:
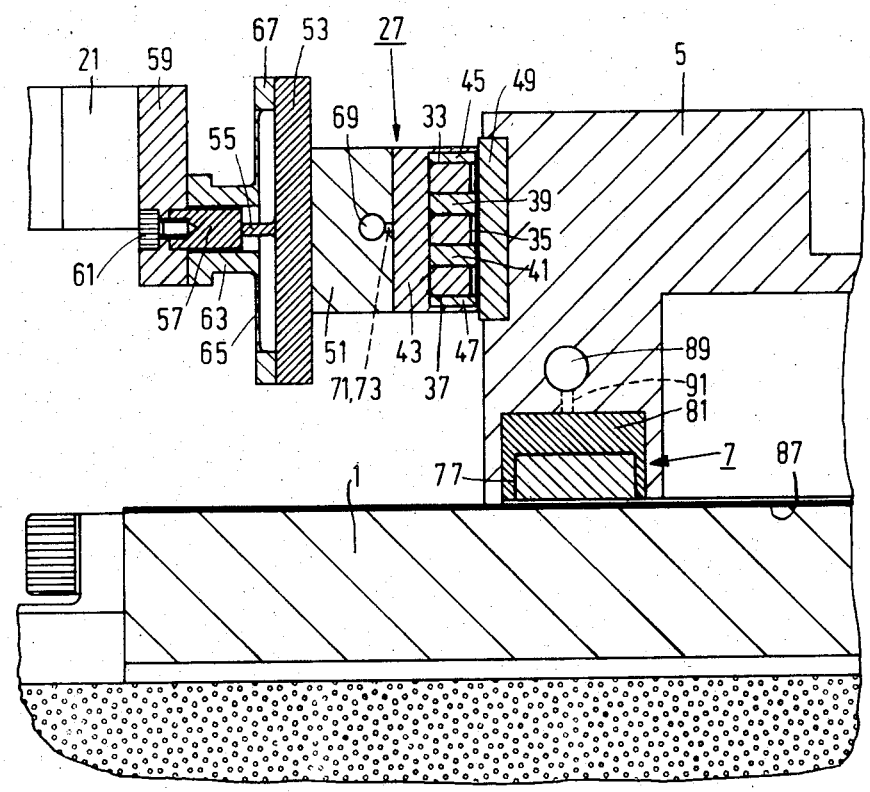
Figure 7:
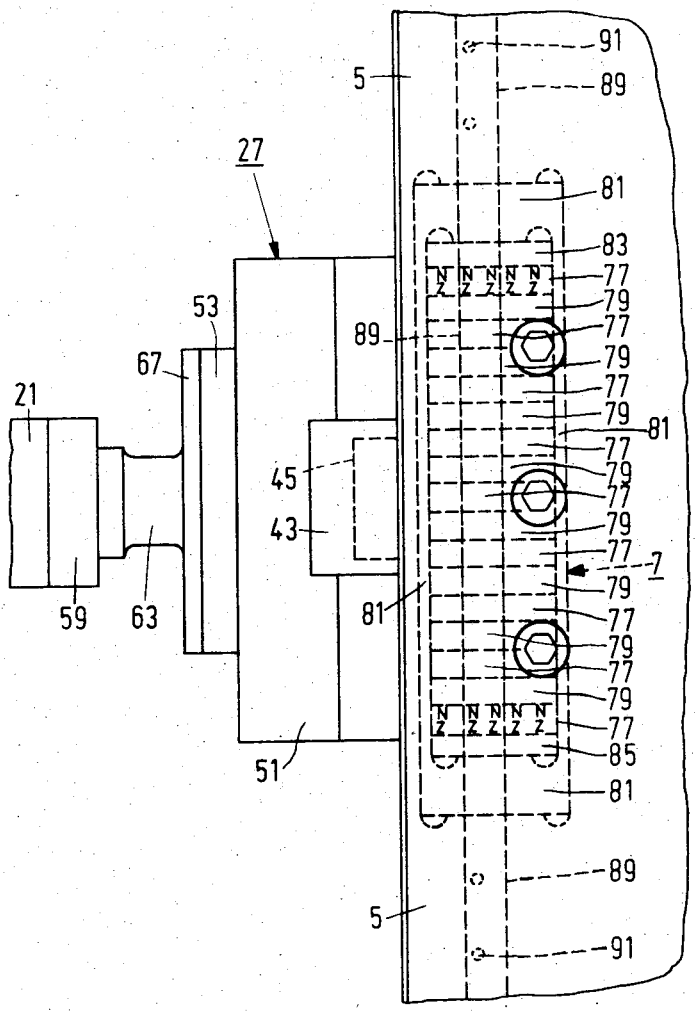
Figure 8:
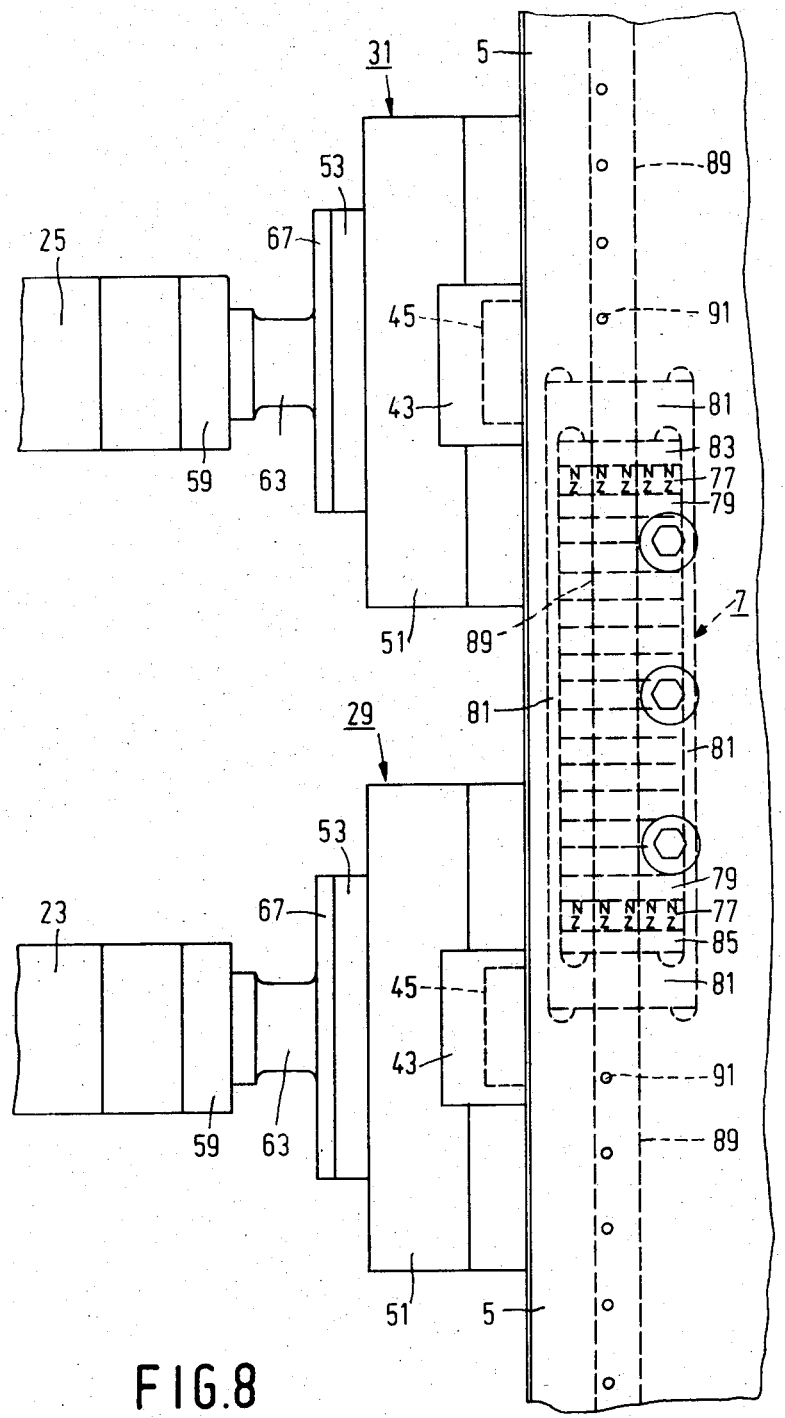
Figure 9:
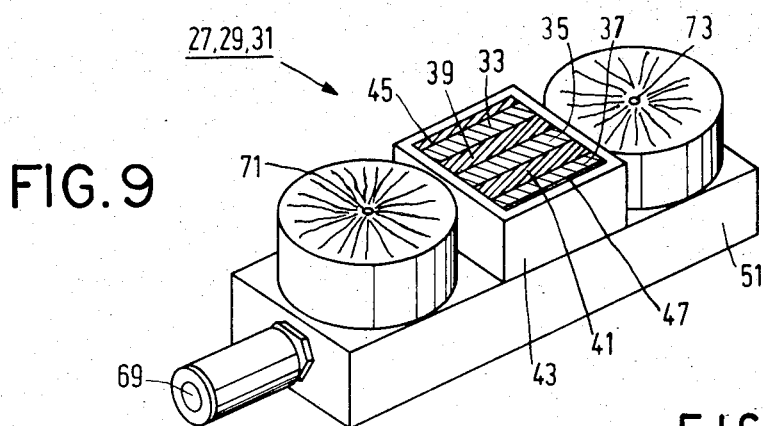
Figure 10B:
Figure 10A:
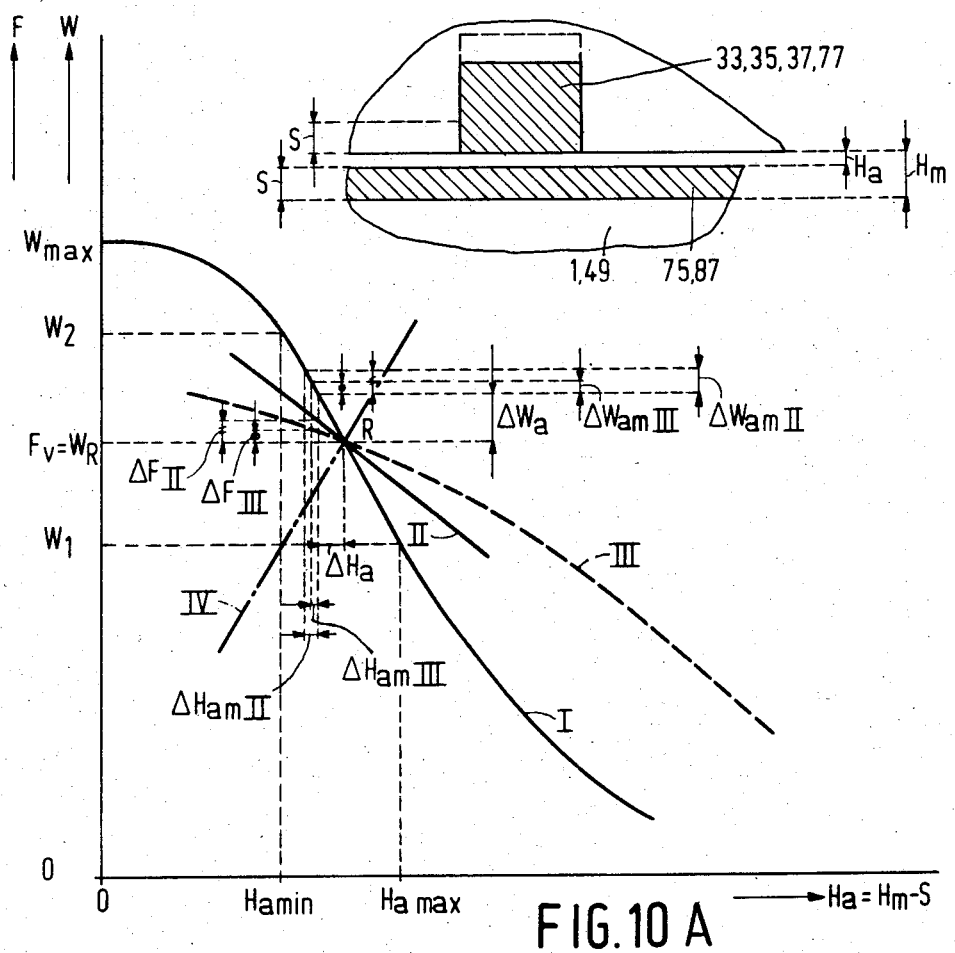
Figure 11:
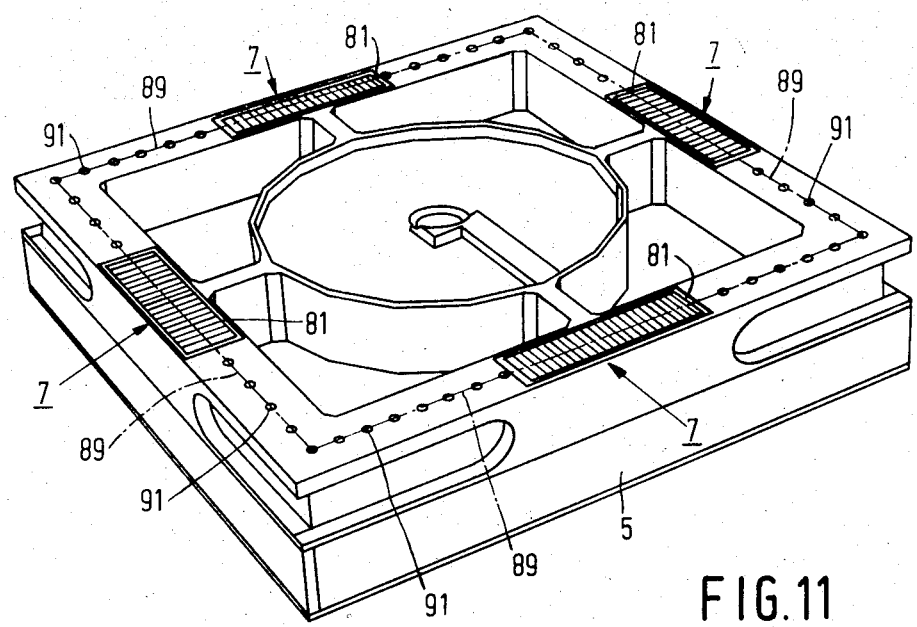

The invention will be described more fully with reference to the drawings, in which:

FIG. 1 is a diagrammatic perspective view of a first embodiment of the positioning device, FIG. 2 is a diagrammatic side elevation of the positioning device shown in FIG. 1, FIG. 3 shows on a reduced scale a diagrammatic plan view of the positioning device shown in FIG. 1 after a rotation of the carrier 5 about a Z-axis, FIG. 4 is a diagrammatic plan view of a second embodiment of the positioning device, FIG. 5 is a diagrammatic plan view of a third embodiment of the positioning device, FIG. 6 is a partial longitudinal sectional view of the positioning device shown in FIG. 1, FIG. 7 is a partial plan view of the positioning device shown in FIG. 6 from a first side, FIG. 8 is a partial plan view of the positioning device shown in FIG. 6 from the second side, FIG. 9 is a diagrammatic perspective view of a thrust and tensile bearing, respectively, for all coordinate directions of the positioning device, FIG. 10A shows a graph, in which the principle of the operation of a thrust and tensile bearing, respectively, is explained, FIG. 10B shows desirable relationships between the magnetic gap and the air gap of disclosed bearings, FIG. 11 is a perspective bottom view of the carrier on a scale which is smaller than the scale of FIGS. 6, 7 and 8, FIG. 12 is a longitudinal sectional view of a translation drive for the positioning device.

The first embodiment of a positioning device shown in FIG. 1 comprises a fixedly arranged flat table 1 in the form of a rectangular planoparallel plate, of which the plate sides are located in a horizontal plane. On the upper surface 3 of the table 1 is guided a rectangular plate-shaped carrier 5 by means of four (multiple) aerostatic vertically operating thrust bearings 7, which are arranged near the corners of the carrier 5. On the carrier 5 is disposed an object 9 to be positioned, which is plate-shaped and which can be secured on the carrier by means of, for example, vacuum suction means. The object 9 may be, for example, a wafer of semiconductor material used in the semiconductor technology. The carrier 5 can be displaced in a first coordinate direction X by means of a translation drive 11, which is of the so-called linear type, while it can be displaced in a second coordinate direction Y by means of a similar translation drive 13. A third translation drive 15 of a similar kind as the drives 11 and 13 serves at the same time to rotate the carriers 5 through an angle $\phi_z$ about a Z-axis, which is illustrated in FIG. 1 by a coordinate system. The X-Y plane is a horizontal plane, in which the upper surface of the object 9 has to be displaced. The translations in the X- and the Y-direction and the rotation about the Z-axis may be effected arbitrarily separately or simultaneously by means of, for example, a computer control of the drives 11, 13 and 15. These drives will be explained more fully with reference to FIG. 12. In the present case, a so-called working point P on the upper surface of the object 9 should coincide with a vertical optical axis 17 of an optical device 19 (see FIG. 2) for exposing a photosensitive layer on the wafer 9. The translations in the X- and Y-directions and the rotation $\phi_z$ about a Z-axis required to this end may be determined, for example, by a method as described in the aforementioned U.S. Pat. No. 3,466,514.

The drives 11, 13 and 15 have straight rods 21, 23 and 25, which can perform translations in the X-direction, the Y-direction and the Y'-direction, respectively, the latter direction being parallel to the Y-direction and lying in the X-Y plane. The rotation $\phi_z$ can be obtained by means of the drive 15 in that the rods 23 and 25 are displaced in a given period of time over different distances. The rods 21, 23 and 25 have secured to them supporting feet 27, 29 and 31, respectively, by means of pivots to be described more fully hereinafter with reference to FIG. 6. The supporting foot 27 accommodates a part of a thrust and tensile bearing, respectively, for exerting pressure and tensile or pushing and pulling forces, respectively, in the X-direction. The supporting feet 29 and 31 are also provided with a part of a thrust and tensile bearing, respectively, for exerting pressure and tensile or pushing and pulling forces, respectively, in the Y-direction and the Y' direction, respectively. The thrust and tensile bearings, respectively, corresponding to the supporting feet 27, 29 and 31 are identical and will be described hereinafter with reference to FIGS. 6, 7, 8 and 10A and 10B. There are arranged in the supporting foot 27 (and hence also in the supporting feet 29 and 31) three plate shaped permanent magnets 33, 35 and 37 (FIG. 6) of rectangular shape, which are separated from each other by two plate-shaped rectangular magnet yokes 39 and 41 of magnetically good conducting material. The packet of permanent magnets and magnet yokes is situated in a box-shaped holder 43 of magnetically poorly conducting material, such as, for example, aluminum and is separated therefrom by two further plate-shaped rectangular magnet yokes 45 and 47 of magnetically good conducting material. In the present case, the permanent magnets are samarium-cobalt magnets, while all magnet yokes are made of mild steel. There is arranged opposite to the permanent magnets 33, 35 and 37 in the carrier 5 a plate 49 of magnetically good conducting material, such as, for example, chromium-steel. The plate 49 forms the second part of the thrust and tensile bearing, respectively. The magnets 33, 35 and 37 are magnetized in the Z-direction. The holder 43 has secured to it a rectangular block 51 of aluminum. On the block 51 is mounted a circular plate 53, which is manufactured together with a comparatively short round wire 55 and a cylindrical block 57 from one piece of steel. The rod 21 is provided with a flange 59, in which a bolt 61 is accommodated, which is screwed into the block 57. The flange 59 has secured to it a cylindrical pipe 63 with an annular diaphragm 65, which is provided with a thickened circular edge 67, which is screwed to the plate 53. The pipe 63, the diaphragm 65 and the edge 67 are manufactured from one piece of steel. The diaphram 65 forms together with the wire 55 a pivot, by means of which the supporting foot 27 can tilt with respect to the flange 59 in the vertical plane (plane of the drawing in FIG. 6) and in the horizontal plane (at right angles to the plane of the drawing in FIG. 6). The coupling thus obtained between the supporting foot 27 and the flange 59 is rigid against torsion, which means that a large resistance is offered to rotation of the supporting foot 27 about the X-axis. The block 51 is provided with a duct 69 connected to a source of compressed air (not shown) for the supply of air to the air gap between the supporting foot 27 and the plate 49 and the carrier 5, respectively. For this purpose, the duct 69 is connected to two lateral ducts 71 and 73, which are located on either side of the packet of magnets (FIG. 9). FIG. 2 shows diagrammatically the supporting foot 27 and the coupling of the supporting foot 27 to the rod 21 (only one magnet is shown). The regions of the air bearing and the magnetic pre-stress are consequently separated from each other. The supporting feet 27, 29 and 31 constitute together with the corresponding plates 49 and the associated air gaps a thrust and tensile bearing, respectively, which can transfer both pressure and tensile forces from the rods 21, 23 and 25 to the carrier 5. Normally, a viscous contactless bearing can transfer only pressure forces. In the case of the present static air bearing, however, tensile forces can also be transferred. This is achieved in that the bearing is magnetically pre-stressed by means of the permanent magnets 33, 35 and 37. The magnetic pre-tension must be larger than the maximum tensile force exerted by the rod 21 on the carrier 5. The tensile force in the rod 21 is twice the tensile force in each of the rods 23 and 25. The maximum tensile force is mainly determined by the required acceleration and deceleration forces, respectively, for the translatory and rotary movement, respectively, of the carrier 5. In general, a smallest possible mass of the carrier 5 and the object 9 present thereon will be aimed at. In order to obtain a bearing having optimum properties, more particularly in order to obtain a bearing having an optimum rigidity, it is to be preferred to choose the magnetic pre-stress so that with a changing load of the bearing a smallest possible variation of the size of the air gap occurs. The optimization of the bearing will be described hereinafter with reference to FIG. 10A, in which the size $H_a$ of the air gap is plotted on the abscissa, while the bearing capacity W and the magnetic attraction force F of the bearing are plotted on the ordinate.

In FIG. 10A, the curve I represents the bearing capacity of the bearing. It is assumed that the working point R is located in the middle of a region of the curve I, which is characterized by a substantially constant rigidity dW/dH of reasonable value and which lies between the bearing capacity values $W_1$ and $W_2$. The bearing capacity associated with the working point R is $W_R$. Air bearings having such a characteristic are usual. if there should indeed by operated in the working point R, it is necessary to load the air bearing with a force which is equal to $W_R$. In the present case, this load is obtained by means of a magnetic pretension $F_V=W_R$, which is also larger than the maximum occurring tensile force and pressure force, respectively, in the rod 21. The maximum load of the bearing is therefore equal to the sum of the magnetic pre-tension $F_V$ and the maximum pressure force, while the minimum load of the bearing is equal to the pre-tension $F_V$ minus the maximum tensile force. Preferably, the maximum load is chosen to be smaller than $W_2$ and the minimum load is chosen to be larger than $W_1$. In order to obtain a magnetic pre-tension corresponding to the point R, it is necessary that the curve II (only the linear part of the curve II is shown) of the magnetic attraction force F has a point of intersection with the curve I of the bearing capacity W which coincides with the point R. Since in general the magnetic pre-tension $F_V$ corresponds to a magnetic gap $H_m$ located outside the region of air gaps $H_{a\ max} - H_{a\ min}$ ($H_m > H_a$ max), a specific step has to be taken to cause the point of intersection of the curves I and II to coincide with the point R which is chosen to be the working point. This step consists in that a magnetic gap $H_m$ is used, which exceeds by an amount S the air gap $H_a$. As shown with the detail illustrated in FIG. 10B, this is achieved in that either the magnets 33,35,37 are arranged at a distance S from the air gap in the supporting foot 27 or in that the relevant surface of the carrier 5 is provided with a layer 75 which magnetically behaves like air. The layer 75 then covers the magnetically conducting plate 49. In the present case, the magnets 33, 35 and 37 are arranged in the supporting feet 27, 29 and 31 at a distance S from the air gap. In the detail of the magnet arrangement illustrated in FIG. 10B, this is indicated in dotted lines. The carrier 5 is journalled on the table 1 in the vertical direction Z by means of a specific layer 87, as will be described more fully hereinafter. It should be noted that with arrangements by means of which very accurate displacements have to be performed, a comparatively large rigidity dW/dH of the air bearing in a comparatively large region of air gaps ($H_a$ max$-H_a$ min) will be aimed at so that load variations will have a smallest possible influence on the size of the air gap and hence on the position of the object to be displaced.

As appears from FIG. 10A, there is operated in a region of magnetic gaps in which there exists a linear relation between the magnetic attraction force F and the magnetic gap $H_m$. The part utilized of the curve II therefore is in fact a straight line. This is approximately the case when the air gap is sufficiently large and furthermore the value of the magnetic saturation of the magnet yokes 39, 41, 45 and 47 is comparatively high. However, it is to be preferred to choose for the magnet yokes 39, 41, 45 and 47 a material having a comparatively low magnetic saturation value (such as, for example, mild steel) so that the magnet yokes 39, 41, 45 and 47 become magnetically saturated in the region $H_a$ max$-H_a$ min. The effect of the occurrence of magnetic saturation in the magnet yokes 39, 41, 45 and 47 will be explained with reference to the curve III in FIG. 10A, which in this case approximately has the shape shown.

If it is assumed that the load of the bearing is subjected to a variation $\Delta W_a$, the air gap $H_a$ and also the magnetic gap $H_m$ vary by an amount $\Delta H_a$. The variation in the magnetic attraction force F corresponding to this amount $\Delta H_a$ is in the case of curve II $\Delta F_{II}$ and in the case of curve III $\Delta F_{III}$. It will be clear that $\Delta F_{II}$ is larger than $\Delta F_{III}$ due to the flatter course of curve III in the relevant region of air gaps. Due to the variation in magnetic attraction force F of a value $\Delta F_{II}$ and $\Delta F_{III}$, respectively, in fact the load W consequently also varies by an amount $\Delta W_{a\ m\ II}$ and $\Delta W_{a\ m\ III}$, respectively. Since $\Delta W_{a\ m\ II}$ is larger than $\Delta W_{a\ m\ III}$, in the case of curve II the limit value $W_2$ will consequently be reached earlier than in the case of curve III with load variations exceeding $\Delta W_a$. This means that the region of the optimum bearing stiffness ($W_2-W_1$) is consequently left earlier with magnet yokes 39, 41, 45 and 47 not becoming saturated than with magnet yokes becoming saturated. Preferably, a magnet configuration will therefore be chosen which yields a variation as shown for curve III. The ideal case arises if curve III on the lefthand side of the working point R approaches the line corresponding to the horizontal line through $F_V=W_R$. This line then forms an asymptote of curve III.

In the case of a rectangular carrier 5, the thrust bearings 7 can be arranged near the corners of the carrier, as shown diagrammatically in FIG. 1, or near the centres of the sides of the carrier, as shown in FIGS. 2, 6, 7, 8 and 11. The thrust bearings 7 for journalling the carrier 5 in the Z-direction are preferably arranged in the manner shown in FIGS. 2, 6, 7, 8 and 11 for the sake of constructive simplicity. Each of the four thrust bearings 7 is composed of a packet of nine permanent samarium-cobalt magnets 77, which are separated from each other by eight magnet yokes 79 of magnetically good conducting material, such as mild steel. The packet of nine magnets 77 is separated from a box-shaped holder 81 of magnetically poorly conducting material, such as, for example, aluminum, by two magnet yokes 83 and 85 of mild steel. The magnets 77 and the magnet yokes 79, 83 and 85 are plate-shaped and rectangular. The direction of magnetization of the two packets of magnets 77 extending parallel to the X-direction is parallel to the X-direction, while the direction of magnetization of the two packets of magnets 77 extending parallel to the Y-direction is parallel to the Y-direction (FIGS. 7, 8 and 11). However, these directions of magnetization may alternatively be as indicated in FIG. 2, i.e. rotated through 90° with respect to the aforementioned directions. The upper surface of the table 1 made of soft magnetic material, such as, for example, mild steel, is covered by a so-called replica layer 87. This replica layer 87 is made of an epoxy resin with a filler, such as, for example, aluminum oxide, which magnetically behaves like air. FIG. 6 and the illustrated detail of FIG. 10B). By means of the replica layer 87, the magnetic air gap is enlarged effectively by an amount S so that $H_m=H_a+S$. As already stated, it is thus achieved that the curve of the magnetic attraction force F has its point of intersection with the curve of the bearing capacity W in the working point R. Furthermore, the replica layer 87 protects the carrier 5 of mild steel from corrosion. By means of a so-called master plate, which is extremely flat, the replica layer 87 can be flattened during curing. This means that the upper surface of the table 1 need not be extremely flat. The ultimately required extreme flatness is thus obtained in a simple and time-saving manner by means of one master plate for many carriers. Summarizing, this consequently means that the replica layer 87 has a threefold function. Due to the fact that the table 1 is made of soft magnetic material having a low remanence, the risk of small shocks during the movement of the carrier 5 owing to regions having a remanent magnetism induced by the magnets 77 in the table surface is reduced to a minimum. The carrier 5 is provided with a circumferential air duct 89, which is connected to a source of compressed air (not shown). The air duct 89 has a large number of lateral ducts 91, which are uniformly distributed over the circumference of the carrier (FIGS. 6, 7 and 8) and which merge into the air gap between the carrier 5 and the table 1. As a result, an air bearing is obtained over a large part of the circumference of the carrier 5. It should be noted that no lateral ducts 91 are present at the area of the magnets 77. The regions of the air bearing and the magnetic pre-stress are consequently separated from each other.

The air bearings 7 are magnetically pre-stressed with a force $F_V$ which is considerably larger than the maximum load in the Z-direction of the bearing. Preferably, $F_V$ is chosen so that the working point of the bearing is located again in the point R of FIG. 10A. The magnetic pre-tension is consequently not required in this case for absorbing tensile forces. The construction of the carrier is chosen to be as light as possible, as a result of which the overall load in the Z-direction constituted by the weight of the carrier 5 and the object 9 is only a fraction of the magnetic pre-tension $F_V$. With a view to variations in the load of the bearings 9 the same consideration applies as already indicated with reference to FIG. 10B with regard to the variations in $H_a$ and $H_m$. The criterion again is that with variations in the load the variations in $H_a$ and $H_m$ must be as small as possible. It should be noted that also in this case it is to be preferred that the magnet configuration is chosen so that magnetic saturation occurs. For this purpose, the material of the magnet yokes 79, 83 and 85 must have a comparatively low saturation value.

In the second embodiment of the displacement arrangement shown in FIG. 4, there are only two coordinate directions X and Y; the drive in the third coordinate direction Y' is omitted in this case. Furthermore, the rod 23 is connected in the point 93 rigidly to the supporting foot 29. However, the rod 21 is connected in the same manner pivotably to the supporting feet 24 as in the displacement arrangement shown in FIGS. 1, 2, 3 and 6. As a result, a small angular adjustment $\alpha$ can be obtained if an alignment of the carrier 5 with respect to the table 1 is necessary. A small displacement of the rod 23 in the Y-direction permits of obtaining such an angular adjustment $\alpha$. This angular adjustment in fact is a pre-adjustment or calibration, which precedes the displacements which have to bring the object to the working point P. The supporting feet 27 and 29 are again provided with permanent magnets, magnet yokes and air supply ducts, while the carrier 5 is provided with magnetic conducting plates as described in the positioning device shown in FIG. 1. The positioning device shown in FIG. 4 belongs to the category in which a rotation $\phi_z$ about a vertical Z-axis is not necessary for positioning the object.

The third embodiment of the positioning device shown in FIG. 5 again belongs to the category in which a rotation $\phi_z$ about a vertical Z-axis is possible. Also in this case, the rotation $\phi_z$ is obtained by means of the rods 23 and 25. The supporting foot 27 is of the same type as that of the first positioning device, while the supporting feet 29 and 31 as such are omitted. The rods 23 and 25 are now pivotably coupled to a beam-shaped guide 95, which is longer than the distance between the rods and which is made of magnetically conducting material, such as, for example, mild steel. The coupling between the rod 23 and the guide 95 is of the same type as the coupling between the rod 21 and the supporting foot 27, while the coupling between the rod 25 and the guide 95 only comprises a length of wire 55 so that the guide 95 can pivot with respect to the rods 23 and 25. The carrier 5 accommodates two packets of permanent magnets 77. The magnet configuration is of the same kind as already described with reference to the positioning device shown in FIG. 1. In order to obtain a magnetic gap $H_m$ larger than the air gap $H_a$, the magnets 77 are arranged so that their end faces are located at a distance S from the air gap. Instead, use may be made of the aforementioned replica layer having a thickness S. This layer is then applied to the side of the guide 95 facing the magnets. On the carrier 5 is disposed an object 9, such as, for example, a circular semiconductor substrate, while, for example, the centre P' has to coincide with the working point P. An advantage of the positioning device shown in FIG. 5 is the comparatively high rigidity against rotation of the carrier 5 about a vertical Z-axis. Furthermore, it is possible with this arrangement to perform comparatively large displacements parallel to the X-direction with a comparatively small mass of the carrier 5.

Figure 12:
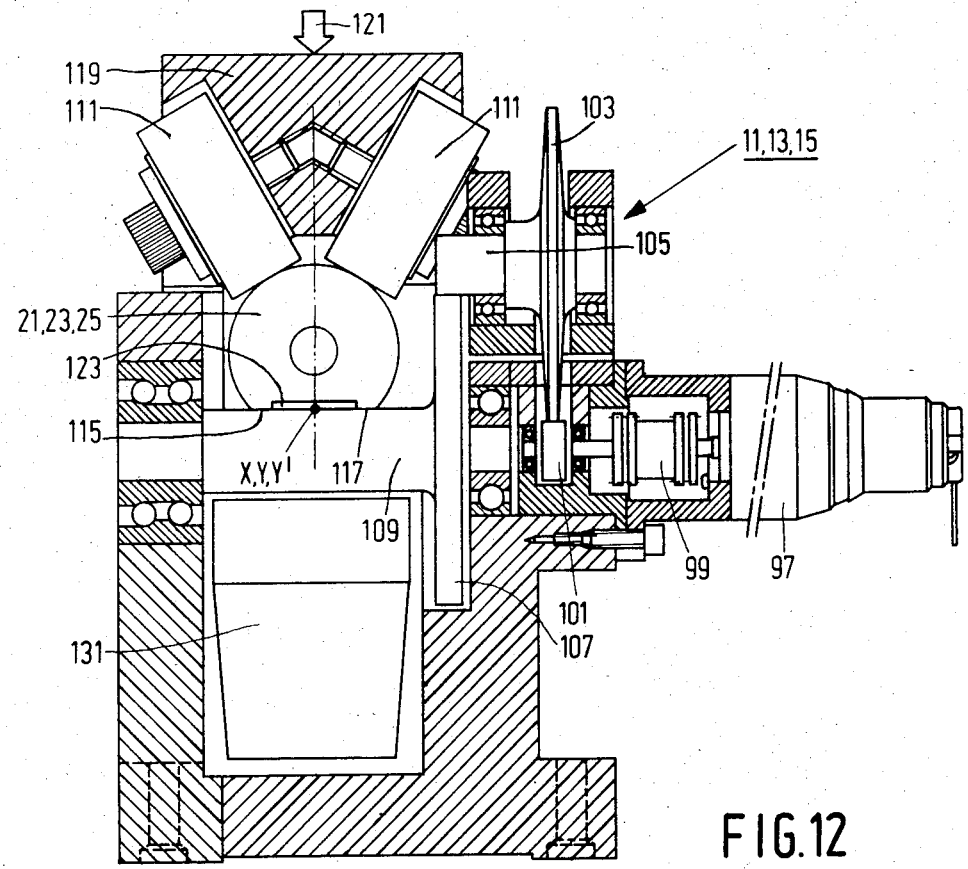

In all the positioning devices described above, use is made of drives 11, 13 and 15, which will be described hereinafter with reference to FIG. 12. The translation drive shown in FIG. 12 comprises a direct current motor 97, which drives a shaft 109 through a flexible coupling 99 and a series of frictional wheels 101, 103, 105 and 107. By means of two pairs of freely rotatable pressure rollers 111 and 113 spaced apart by a certain distance (see also FIG. 2), the rods 21, 23 and 25 are pressed with flat sides 115 and 117 against the relevant driving shaft 109. The pressure rollers 111 and 113 are arranged at an angle to the vertical line and are journalled in a block 119, which is acted upon by a pressure force 121 originating from a spring (not shown). The rolling friction between the flat sides 115 and 119 and the shaft 109 ensures a translation in the X-, Y- and Y' direction of the rods 21, 23 and 25, respectively. The rods 21, 23 and 25 accomodate a strip-shaped measuring scale 123 which extends in the X-, Y- and Y' direction, respectively, and which has alternately comparatively weakly reflecting regions, onto which a light beam 125 is projected by means of a mirror 127 and a lens 129. The reflected light beam is detected by a photodetector arranged in a measuring device 131 in a manner not shown. The measurement signal thus obtained is processed in an electrical servo loop and is then fed back to the electric motor 97. The optical measuring device roughly described above is of the usual kind and is therefore not described in detail. It should be noted that the measuring direction coincides with the X-, Y- and Y' direction, respectively, as a result of which so-called Abbe errors or tilting errors are avoided.

In the positioning devices described above use has invariably been made of air bearings or gas bearing for the vertically operating thrust bearings 7. However, also a liquid may be used as a viscous medium in the thrust bearings 7. In this case, however, it is then necessary for the liquid flowing away to be collected in a satisfactory manner. Although essentially a liquid may be used as a viscous medium for the horizontally operating thrust-tensile bearings, preferably a gas is used because of the relatively complicated collecting means required with the use of a liquid. The vertical thrust bearings may also be replaced by accurate rolling- or ball-bearings, while sliding bearings are also possible. The pre-tension of the viscous contactless bearings can be obtained by means of a weight, a vacuum, a spring or electromagnetically for the vertically operating thrust bearings and by means of vacuum, a spring or electromagnetically for the horizontally operating thrust-tensile bearings. In the case of an electromagnetic pre-tension, the permanent magnets are replaced by an electromagnet, whose excitation can be controlled by means of a sensor, by which the size of the air gap is measured. The magnetic attraction force can then be controlled so that variations in the load of the air bearing or liquid bearing are fully conpensated for by an adapted excitation. A variation of the magnetic attraction force F corresponding thereto is indicated in FIG. 10A by the line IV (dot-and-dash line). It should be noted that the usual electromagnetic bearings without the use of a viscous medium originating from a pressure source do not fall within the scope of the invention. Such electromagnetic bearings are in fact of the so-called dynamic type, whereas according to the invention viscous bearings of the so-called static type with external pressure source are used.

Instead of a packet of permanent magnets, according to the invention use may also be made of a single permanent magnet for each rod 21, 23 and 25. Essentially, a single magnet is also possible for the vertical journalling. The required stiffness against tilting of the carrier 5 can be obtained more readily, however, by several magnets or, as described, by several packets of magnets. Although the invention has been described with reference to a translation drive or a so-called linear drive with frictional couplings, other known linear drives may also be used. Such linear drives may be, for example, so-called screw-nut drives or drives with a shaft guided by rollers or balls. Essentially, all the drives can be used, by which a reciprocating translatory movement can be imparted to the carrier 5 by acting of a force from one side of the carrier 5. The static viscous bearings with external pressure source described may be of different types with regard to the restriction used between the pressure source and the gas and liquid gap, respectively. More particularly, the possibility is mentioned of the use of a so-called diaphragm-compensated viscous bearings. With such a bearing known per se, a very high degree of stiffness can be obtained.

What is claimed is:

1. A positioning device comprising a flat table, a horizontal plate-shaped carrier displaceable in two orthogonal coordinate directions with respect to said flat table, said device including a first translation drive coupled to the carrier for exerting pushing and pulling forces on the carrier in a first coordinate direction, a second translation drive coupled to the carrier for exerting pushing and pulling forces on the carrier in a second coordinate direction at right angles to the first coordinate direction, said forces exerted on the carrier by said first and second drives lying in one horizontal plane, a first horizontally operating static push and pull bearing coupling said first drive to the carrier in a contactless manner via a viscous medium, and a second horizontally operating static push and pull bearing coupling said second drive to the carrier in a contactless manner via a viscous medium, each said first and said second push and pull bearings being pre-stressed in its respective first and second coordinate directions with an associated force acting to attract said carrier to said first and second drives to oppose the respective maximum occurring pulling force between said first and said second drives on the one hand and said carrier on the other hand whereby said drives and said carrier remain in operative relationship with each other notwithstanding the application of said maximum occurring pulling force.

2. A positioning device as claimed in claim 1, wherein said device includes a third translation drive coupled to the carrier for exerting a pushing and pulling force on the carrier in a direction parallel to the second coordinate direction.

3. A positioning device as claimed in claim 2, wherein a third horizontally operating static push and pull bearing couples said third drive to the carrier in a contactless manner via a viscous medium, said third bearing being pre-stressed parallel to the second coordinate direction with an associated force acting to attract said carrier to said third drive to oppose the respective maximum occurring pulling force between the third drive and the carrier whereby said third drive and said carrier remain in operative relationship with each other notwithstanding the application of said maximum occurring pulling force.

4. A positioning device as claimed in claim 3 wherein a permanent magnet comprises the means for pre-stressing said first, second and third bearings.

5. A positioning device as claimed in claim 4, wherein a magnetic circuit is provided for each said permanent magnet, part of each said magnetic circuit being in saturation.

6. A positioning device as claimed in claim 5, wherein each said drive is pivotable about a vertical axis with respect to said carrier.

7. A positioning device as claimed in claim 6, wherein the viscous medium for each bearing is air.

8. A positioning device as claimed in claim 4, wherein said second and third bearings are pre-stressed by means of the number of permanent magnets common to both bearings, said permanent magnets being carried by said carrier.

9. A positioning device as claimed in claim 8, wherein a beam-shaped guide couples said second and third bearings to each other, said guide being pivotable with respect to the second and the third drive about a vertical axis, said first drive being pivotable about a vertical axis with respect to the carrier.

10. A positioning device comprising a flat table, a horizontal plate-shaped carrier displaceable in two orthogonal coordinate directions with respect to said flat table, said device including a first translation drive coupled to the carrier for exerting pushing and pulling forces on the carrier in a first coordinate direction, a second translation drive coupled to the carrier for exerting pushing and pulling forces on the carrier in a second coordinate direction at right angles to the first coordinate direction, said forces exerted on said carrier by said first and second drives lying in one horizontal plane, a first horizontally operating static push and pull bearing coupling said first drive to the carrier in a contactless manner via a viscous medium, and a second horizontally operating static push and pull bearing coupling said second drive to the carrier in a contactless manner via a viscous medium, said first and second bearings both applying attracting and repelling forces to said carrier, said respective repelling force of each bearing offsetting said respective attracting force and the maximum force applied by the respective first and second translation drives in the pushing mode of operation, said respective attracting force of each bearing offsetting said respective repelling force and the maximum force applied by the respective first and second translation devices in the pulling mode of operation, whereby said drives and said carrier are maintained in operative relationship.

11. A positioning device as claimed in claim 10, wherein said device includes a third translation drive coupled to the carrier for exerting a pushing and pulling force on the carrier in a direction parallel to the second coordinate direction.

12. A positioning device as claimed in claim 11, wherein a third horizontally operating static push and pull bearing couples said third drive to the carrier in a contactless manner via a viscous medium, said third bearing providing attracting and repelling forces to said carrier, said respective repelling force offsetting said respective attracting force and the maximum force applied to said third drive in its pushing mode of operation, said respective attracting force offsetting said respective repelling force and the maximum force applied by said third drive in its pulling mode of operation whereby said third drive and said carrier are maintained in operating relationship.

13. A positioning device as claimed in claim 12, wherein permanent magnets provide said attracting forces for said first, second and third bearings.

14. A positioning device as claimed in claim 13, wherein a magnetic circuit is provided for each said permanent magnet, part of each said magnetic circuit being in saturation.

15. A positioning device as claimed in claim 14, wherein the viscous medium for each bearing is air.

* * * * *